"AND" GATE, "OR" GATE, OR "AT LEAST" GATE

Filed May 15, 1963

INVENTORS.
FRANCIS B. SHAFFER
JACK B. BAKER
BY
P. H. Firsht
ATTORNEY.

United States Patent Office 3,341,713

Patented Sept. 12, 1967

3,341,713

"AND" GATE, "OR" GATE, OR "AT LEAST" GATE

Francis B. Shaffer, Palos Verdes Estates, and Jack B. Baker, China Lake, Calif., assignors to the United States of America as represented by the Secretary of the Navy Filed May 15, 1963, Ser. No. 280,757
1 Claim. (Cl. 307—88.5)

The invention herein described may be manufactured and used by or for the Government of the United States of America for governmental purposes without the payment of any royalties thereon or therefor.

The present invention relates generally to input circuits, and more particularly to switching circuits utilizing input signals imposed through Zener diodes for providing a circuit control function.

Switching circuits for direct current (D.C.) circuits often are provided with a plurality of input terminals and utilize transistors as a "switch" means to close a desired circuit when a predetermined signal condition exists at the switching circuit's input terminals. Such circuits are commonly referred to as gate circuits, and function as AND gates or OR gates. The AND gate comprises a circuit which requires input signals from a desired plurality of terminals, while the OR gate utilizes an input signal from one or more of a plurality of input terminals.

In some instances it may be necessary to utilize an AT LEAST gate, which varies somewhat from either the above-mentioned AND and OR gate circuits in that the AT LEAST gate functions when there is an input signal present at less than all of the circuit's input terminals, but is present at at least a predetermined plurality thereof.

Various designs for gate circuits have been employed in the past including those which are referred to as resistor-diode, vacuum tube, and transistor type gate circuits. While each of these designs provide specific advantages, certain disadvantages accompany their use. For example, when utilizing resistor-diode gate circuits it is necessary that the output impedance of a given signal must be small when compared to the value of the gate resistors, and further, gate circuits of this type usually require a diode for each signal input terminal. The use of vacuum tubes, and transistor type gate circuits have, in the past been limited due to difficulties encountered in instances where it is necessary to accommodate input signals from more than a single pair of terminals. Such limitations are imposed on known gate circuit design through the requirement that the biasing of the transistors or vacuum tubes be closely controlled in order to achieve a proper gating function for the switching circuit.

The purpose of this invention is to provide a gating circuit which embraces the advantages of the above-mentioned gate circuits, while eliminating the disadvantages through providing a unique arrangement of gate circuit components utilizing a Zener diode for controlling the function of a junction transistor, whereby multiple signal input terminals may be connected with a single transistor to provide a simplified transistor gate circuit for accommodating a multiplicity of input signals.

Therefore, it is an object of the instant invention to provide transistor gate circuits having a simplified biasing arrangement.

Another object is to provide a transistor gate circuit having a multiplicity of signal input terminals.

Still another object is to provide a single-stage gate circuit which functions as an AT LEAST gate.

A further object is to provide a single-stage gate circuit, the functions of which may be readily varied between AND, OR, and AT LEAST functions.

Other objects, advantages and novel features of the invention will become apparent from the following detailed description of the invention when considered in conjunction with the accompanying drawings wherein.

Figure 1:
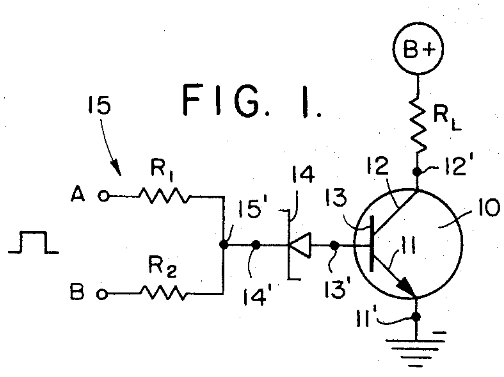
FIG. 1 is a schematic view of dual signal input gate circuit utilizing an NPN transistor.

Referring now more specifically to the drawings wherein like reference characters designate like or corresponding parts throughout the several views, there is shown in FIG. 1 a dual input gate circuit utilizing an NPN transistor, generally designated 10 having an emitter 11, a collector 12, and a base 13. A plurality of terminals 11', 12' and 13' are provided for connecting the transistor 10 with a load circuit, exemplified in the drawings as a load resistor $R_L$, ground, and a Zener or breakdown diode 14. A terminal 14' serves to connect the Zener diode 14 with a resistor network, generally designated 15, which is provided with a pair of resistors $R_1$ and $R_2$ for forming a voltage divider circuit. The resistors are connected at a common terminal 15' to provide a resistor network output signal to the Zener diode 14, which signal will depend on the voltage dividing function of resistors $R_1$ and $R_2$ of the voltage dividing circuit or network 15. If found desirable, a resistor, not shown, may be interposed between the terminal 15' and ground.

The Zener diode 14 comprises a PN junction transistor of a well known design, therefore, it suffices to understand that the diode 14 is provided with a PN junction having a determinable "breakover" voltage value so that it serves to block current flow and becomes conductive only when a predetermined reversed biased potential is imposed thereacross, whereby as a potential builds to a preselected value the Zener diode "breaks over" or becomes highly conductive. Hence, when electrical input signals from the terminal 15' reaches a predetermined voltage value, the diode 14 becomes highly conductive and continues to conduct the electrical signals until such time as the voltage provided at the terminal 15' and applied across the Zener diode 14 decreases to a value below the "breakover" voltage value of the diode 14, at which time the diode ceases to be conductive so that network output signal conduction through the Zener diode 14 ceases.

The terminals A and B of the network 15 are connected with suitable pulse sources which serve to provide circuit input pulses to the network 15.

As aforementioned, the transistor 10 is connected with a desired circuit, such as the load resistor $R_L$, across which is imposed a positive voltage from a source designated B+, FIG. 1. Since the transistor 10 is of the NPN type having its emitter 11 connected through the emitter terminal 11' with ground, current flow from the source B+ through the load $R_L$ is established to ground only when a positive biasing voltage is imposed on the transistor base 13 to "turn" the transistor "on," or to cause the transistor to enter a conductive state.

Hence, it is to be understood that where a current flow through the load $R_L$ is to be controlled in accordance with a simultaneous input of signal pulses of predetermined value from terminals A and B of the network 15, a breakover voltage value, is imposed across the Zener diode 14 and a current determined by the values of the resistors $R_1$ and $R_2$, the voltages of the input pulses, and the breakover voltage of the Zener diode is applied to the base 13 of the transistor 10 through connecting terminals 13' and 14'. The value of the Zener diode 14 is chosen in accordance with a contemplated average signal voltage output from resistors $R_1$ and $R_2$ which is present at the resistor network's output terminal 15'. Where it is desired that the circuit function as an AND gate circuit, it is necessary that the breakover voltage value for the Zener diode 14 be higher than the output from a single resistor of the network 15, but being of a value no more, and preferably slightly less, than a sum of the contemplated output voltage values from both of the resistors $R_1$ and $R_2$. Therefore, when the transistor 10 is in a nonconductive "off" state, and a positive pulse less than a predetermined breakover value is present at the terminal 15' of the network 15, the transistor 10 remains in its off state due to the blocking effect of the diode 14. Upon application of positive pulses, from both of the resistors $R_1$ and $R_2$ of the network 15, the average value of the voltage present at terminal 15' is raised above the breakover voltage value of the Zener diode 14. The diode 14 is then caused to attain a conductive state so that the positive network output voltage is applied to the base 13 of the transistor 10 to cause it to become turned on to thus establish a circuit between the source B+ and ground through the load $R_L$. As long as the average output voltage value at the terminal 15' remains above the Zener diode's breakover voltage value, the transistor 10 will remain on. When the output voltage value at terminal 15' drops below the breakover voltage value, the Zener diode 14 is rendered non-conductive and the transistor 10 is turned off to, in effect, open the circuit between the source B+ and ground.

It is to be particularly noted that the gating circuit illustrated in FIG. 1 has been described in terms of its function as an AND circuit, however, simply by selecting a Zener diode 14 having a breakover voltage below the output value of a single resistor of the network 15, but above zero, the circuit may be utilized as an OR gate circuit capable of establishing a flow of current through the load $R_L$ when a positive pulse is applied to either of the terminal A or B of the network 15. This simplified conversion characteristic of the instant invention renders the circuit highly desirable when the function of a given circuit is to be varied between an AND circuit and an OR circuit.

Figure 2:
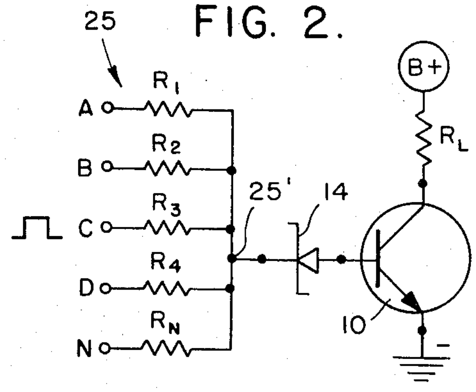
FIG. 2 is a schematic view of a multiple input gate circuit, having N number of input terminals, utilizing an NPN transistor.

Turning now to FIG. 2, there is shown a modified multiple input gate circuit having a network 25 which is provided with "N" number of input terminals commonly connected at a common output terminal 25' which is connected with the Zener diode 14 and functions in a manner similar to that described in conjunction with the detailed description of FIG. 1.

However, it is to be particularly noted that the network 25 is provided with a multiple or "N" number of input terminals, each of which serve to provide a pulsed input signal to an associated resistor ($R_1$–$R_N$). For purposes of illustration it may be considered that the resistor network 25 is provided with a given number of resistors $R_1$, $R_2$, $R_3$, $R_4$ and $R_N$, having an equal resistance value. It may be assumed that: when an input pulse is present at any of the terminals A, B, C, D, . . . , N the potential at the respective terminal is E; that when an input pulse is not present at any of the same aforementioned terminals, the potential at the respective terminal is 0 (zero); that N is the total number of signal input terminals; that E is the output from the resistor network applied to the Zener diode 14; that $V_Z$ is the Zener diode breakover voltage value; and that M is the number of input terminals each of which must receive an input pulse signal of voltage E in order to turn on the transistor 10. Hence it is to be understood that where $V_Z$ is less than E, but greater than $$\frac{(N-1)}{N}E$$

the Zener diode 14 will conduct only when all resistors have an input signal imposed thereacross, thus causing the circuit to function as an AND gate.

In order to provide for input signals from N terminals, the Zener diode value $V_Z$ is selected to be greater than $$\frac{(N-1)}{N}E$$

but less than E, so that the gate will close the circuit through the load $R_L$ when all of the input terminals are simultaneously providing input signals for the terminal 25'.

As in the case of the circuit having a dual input network 15, a gate circuit utilizing a multiple input network 25 may be readily converted to an OR gate merely by substituting, within the gate circuit, a Zener diode 14 having desired breakover voltage value greater than zero, but less than the output of a single network resistor. For example, if it is desired to have the transistor 10 turned on in instances where only one of the network's input terminals provides a pulsed input signal, the value of the Zener diode 14 must satisfy the following; $0<V_Z<(E/N)$ When it is found desirable to utilize a signal input at a plurality, or more than one, of the input terminals, but less than all thereof, an AT LEAST gate may be readily effected within the basic circuit merely by selecting a proper breakover value for the diode 14 which conforms to the condition $$E\frac{M-1}{N}<V_Z<\frac{EM}{N}$$

Therefore, it is understood that the transistor 10 will turn on to establish a current flow through the load $R_L$ when a signal input is applied to less than all of the input terminals, but to at least a preselected plurality, or M, number thereof.

Figure 3:
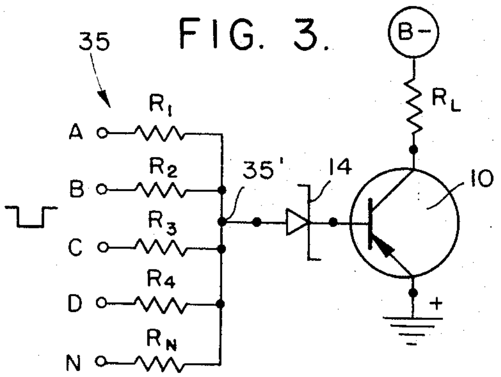
FIGS. 3 and 5 are schematic views illustrating alternative gate circuit arrangements utilizing PNP transistor components.

While the description of the gates of the present invention, hereinabove set forth, has been devoted primarily to circuits utilizing positive voltage input signal pulses, FIGS. 1 and 2, it is to be understood that a gate circuit may be activated utilizing negative pulses simply by providing a PNP type transistor, for example, as shown in FIG. 3, having its based connected, through the Zener diode 14, with a network 35 so that the transistor 10 will be turned on when a negative potential greater than the breakover voltage $V_Z$ is applied across the Zener diode 14 to bias the transistor 10 to a conductive state for thus causing a current to flow through the load $R_L$ between ground and a negative voltage source generally designated B−. Hence, it is to be understood that the basic circuit components may be readily arranged to accommodate negative signal pulses.

Figure 4:
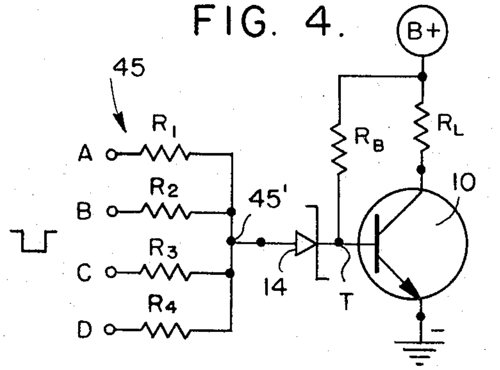
FIG. 4 is a schematic view illustrating a multiple negative input gate circuit utilizing an NPN transistor in saturated state.
Figure 5:
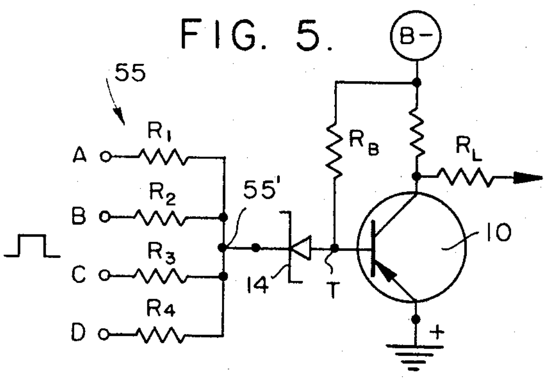

It is to be particularly noted that it is entirely feasible to utilize a biasing resistor $R_B$, FIGS. 4 and 5, to apply a D.C. voltage to the base of the transistor 10 so that the transistor will normally be maintained in a saturated state. The value of the biasing voltage applied to the transistor base is chosen so that the transistor will conduct current through the load $R_L$ between a given source and ground. While the transistor 10 is in its saturated state, the voltage drop across the load remains constant, however, when the Zener diode 14 becomes conductive, through the application thereto of an output signal from the resistor network greater than the preselected breakover voltage value of the diode 14, the biasing voltage applied to the base is overcome in order that the transistor's emitter-base circuit may be reverse-biased so that the transistor 10 will be turned off. Whether a positive input, or negative input is to be utilized to turn the transistor off will of necessity depend upon the type of transistor utilized. As illustrated in FIG. 4, an NPN junction transistor may be biased to a saturation state through a biasing resistor $R_B$, connected at a terminal T between transistor 10 and the Zener diode, so that a negative input pulse from the output terminal 45' of the network 45 will cause the emitter-base circuit to become reversed biased. Where a PNP transistor is provided, as in FIG. 5, a biasing resistor $R_B$ is connected with the transistor's base to establish a saturated state for the transistor 10. As a positive voltage is applied from the network 55, through a terminal 55' and the Zener diode 14, the base-emitter circuit of the transistor 10 becomes reversed biased and the transistor is turned off, and therefore, no current flow through the load resistor $R_L$ will occur so long as a positive voltage is applied through the Zener diode 14.

Therefore, transistors having a normally saturated state may be readily provided in the gate circuits of the present invention so that positive, or if desired, negative input signals obtained at the resistor network's output terminal may be selectively utilized to effect either an AND, OR or an AT LEAST function.

Furthermore, under certain predetermined conditions, the input signals may consist of a potential E at any of the terminals A, B, C, D, . . . , N when the respective input pulse is present, and a smaller potential *e* at the same terminals when the respective input pulse is not present. In such instances it becomes necessary to select a proper value for the breakover value of the Zener diode 14 which will accommodate the absence of a zero signal voltage input condition at the respective input terminals of the selected resistor network. Such an accommodation may be afforded by choosing a diode breakover value $V_Z$, for the Zener diode 14, which satisfies a selected one of the following conditions:

For an OR gate:

$$e<V_Z<\frac{E+e(N-1)}{N}$$

For an AND gate:

$$\frac{E(N-1)+e}{N}<V_Z<E$$

For an AT LEAST gate:

$$\frac{E(M-1)+e(N-M+1)}{N}<V_Z<\frac{EM+e(N-M)}{N}$$

It is to be particularly noted that E is the potential at any of the input terminals when an input pulse is present at that terminal, and *e* is the potential at any of the input terminals when an input pulse is not present at that terminal, and M is the minimum number of input terminals which must receive an input pulse signal in order to actuate the AT LEAST gate. The ability of the circuit to reject undesired intelligence or noise represented by the potential *e* which is present when the input pulse is not present and which is blocked by the Zener diode 14 from the base 13 of the transistor 10.

In summary, the operation of the various modifications of the instant invention may be described utilizing a single illustration of operation.

It is to be understood that when a resistor network which basically functions as a voltage divider, provides an output signal $$E_{out}=\frac{En+e(N-n)}{N}$$

(where *n* is the number of input terminals receiving an input signal and consequently having a potential E) which output signal exceeds the breakover voltage of a Zener diode 14 interposed between the network and a gate transistor, then the diode serves to pass the network's output signal to the base of the transistor so that when the output voltage from the resistor network obtains a preselected average value the Zener diode becomes conductive and passes the signals to the transistor base to establish a conductive condition therefor.

The network's output voltage $E_{out}$ is a determinable value, since each of the resistors thereof are of a known value and have a determinable or contemplated input value. Hence, it is possible to select and provide a Zener diode having a breakover value which allows the Zener diode to conduct a voltage output signal from the network to the base of a transistor only when a voltage $E_{out}$ is obtained from the resistor network's output terminal and is imposed across the Zener diode.

Therefore, it is understood that in accordance with the hereinabove disclosed invention there is provided a one-stage gate circuit, utilizing a single diode and a single transistor, which circuit may be provided with a predetermined multiplicity of signal input terminals and which may be converted from an AND to an OR or an AT LEAST gate, utilizing either positive or negative input signals, merely by changing the value of the Zener diode.

Obviously many modifications and variations of the present invention are possible in the light of the above teachings. It is therefore to be understood that within the scope of the appended claim the invention may be practiced otherwise than as specifically described.

What is claimed is:

An electronic switching circuit for providing an electronic output signal responsive to a plurality of input signals comprising:

(a) a power source with two output connections;
(b) a source of a plurality of input signals;
(c) a plurality of substantially equally resistive input resistors with two electrodes each, one of said electrodes of each of said resistors coupled to a common connection, the other one of said electrodes of each of said respective resistors coupled to one of said plurality of input signals;
(d) a transistor having an emitter, base, and collector;
(e) a load impedance connected between said collector and one of said power source connections, the other of said power source connections being connected to said emitter;
(f) a Zener diode having two electrodes, one of which is connected to said base and the other of which is connected to said common connection of said input resistors, whereby said transistor changes conduction state upon achieving a predetermined condition of said input signals.

References Cited

UNITED STATES PATENTS

| | | | |
|---|---|---|---|
| 2,950,439 | 8/1960 | Gerbitz et al. | 324—158 |
| 2,963,698 | 12/1960 | Siccomb | 340—347 |
| 2,964,653 | 12/1960 | Cagle et al. | 307—88.5 |
| 2,986,652 | 5/1961 | Eachus | 307—88.5 |
| 3,046,418 | 7/1962 | Eachus | 307—88.5 |
| 3,098,962 | 7/1963 | Berg | 320—39 |
| 3,100,269 | 8/1963 | Barry | 307—88.5 |
| 3,106,644 | 10/1963 | Retzinger | 307—88.5 |
| 3,153,152 | 10/1964 | Hoffman | 307—88.5 |
| 3,153,200 | 10/1964 | Wahrman | 328—55 |
| 3,252,051 | 5/1966 | Walker | 317—12 |

OTHER REFERENCES

Lougue Mackay: "Avalanche Region Diode Logic," April 1959, p. 23, vol. 1, No. 6 of the I.B.M. Tech. Disc. Bulletin.

Antipov: "Current Mode Nand," August 1961, p. 78, vol. 4, No. 3 of the I.B.M. Tech. Disc. Bulletin.

Trampel: "High-Speed, Non-Saturating Logic Block," November 1961, p. 34, vol. 4, No. 6 of the I.B.M. Tech. Disc. Bulletin.

JOHN W. HUCKERT, *Primary Examiner.*

R. F. SANDLER, *Assistant Examiner.*